United States Patent [19]

Yerkes et al.

[11] 4,116,718

[45] Sep. 26, 1978

[54] PHOTOVOLTAIC ARRAY INCLUDING LIGHT DIFFUSER

[75] Inventors: John W. Yerkes, Granada Hills; James E. Avery, Burbank, both of Calif.

[73] Assignee: Atlantic Richfield Company, Los Angeles, Calif.

[21] Appl. No.: 884,861

[22] Filed: Mar. 9, 1978

[51] Int. Cl.² ............................................ H01L 31/04
[52] U.S. Cl. ................................................ 136/89 PC
[58] Field of Search ........................... 136/89 PC, 89 P

[56] References Cited

U.S. PATENT DOCUMENTS

| | | | |
|---|---|---|---|
| 2,904,612 | 9/1959 | Regnier | 136/89 |
| 3,310,439 | 3/1967 | Seney | 136/89 |
| 3,971,672 | 7/1976 | Lampkin | 136/89 |
| 3,973,994 | 8/1976 | Redfield | 136/89 |
| 3,977,904 | 8/1976 | Kohler | 136/89 |
| 4,025,786 | 5/1977 | Hamilton | 250/211 R |
| 4,053,327 | 10/1977 | Meulenberg, Jr. | 136/89 CC |

Primary Examiner—John H. Mack
Assistant Examiner—Aaron Weisstuch
Attorney, Agent, or Firm—Roderick W. MacDonald

[57] ABSTRACT

A photovoltaic array composed of a light transmitting member having a plurality of sides, at least one photovoltaic means carried by at least one of said sides, and a diffusive member covering a portion of said device.

24 Claims, 11 Drawing Figures

PHOTOVOLTAIC ARRAY INCLUDING LIGHT DIFFUSER

BACKGROUND OF THE INVENTION

It is well known that photovoltaic cells use specially prepared semiconductor junctions to convert energy from sunlight to electricity.

Heretofore a plurality of photovoltaic cells have been arranged in a closely packed configuration on a structural supporting member. In the past it has been normal to put the cells on top of a supporting substrate. The exposed upper side of the cells were then covered by an environmental barrier which was optically clear.

Recently, commercial photovoltaic arrays have been built which use an optically clear superstrate concept. In the superstrate situation cells are bonded to the back of a light transmitting member which also serves as the structural supporting member. In either the substrate or superstrate form round cells are normally used and this leaves open interstices between the cells. Some of the light that hits these open interstices passes straight on out of the photovoltaic array and is lost for conversion to electricity. Some of the light which hits these interstices is reflected back towards the side of the light transmitting member through which it initially entered. Such back reflection is at essentially the same angle as initial entry and the back reflected light therefore escapes out said first side rather than being reflected back into the light transmitting member. If the interstices are darkened, they absorb light and are thereby heated which can be detrimental to the efficiency of the photovoltaic cells.

SUMMARY OF THE INVENTION

According to this invention there is provided a photovoltaic array comprising a light transmitting member, said light transmitting member having at least one pair of opposed essentially parallel sides, a plurality of photovoltaic cells carried by at least one of said sides with open interstices between adjacent cells, and a diffusive member covering at least the interstices between said cells.

Accordingly, it is an object of this invention to provide a new and improved photovoltaic array.

Other aspects, objects and advantages of this invention will be apparent to those skilled in the art from this disclosure and the appended claims.

DETAILED DESCRIPTION OF THE INVENTION

Figure 1:
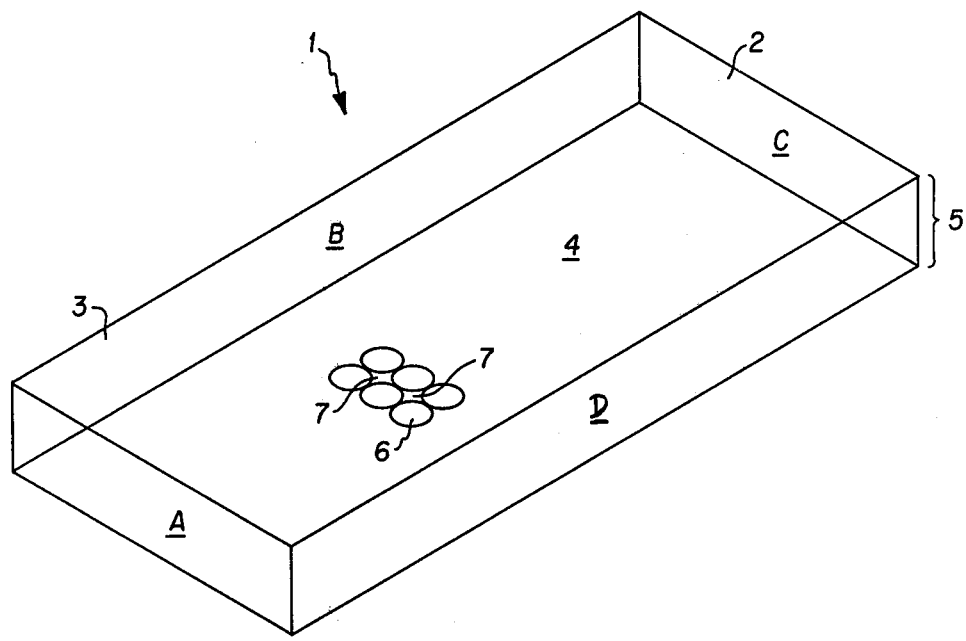
FIG. 1 shows a prior art photovoltaic device.

More specifically, FIG. 1 shows a photovoltaic array 1 composed of a light transmitting superstrate member 2 which has parallel and opposed large surface area sides 3 and 4 joined by a thin upstanding edge face 5, edge face 5 being composed of the four upstanding faces A through D. Bottom side 4 carries a plurality of photovoltaic cells 6. Cells 6 are packed as closely together as possible but due to their round configuration still leave open interstices 7.

Member 2 is composed of a transparent material which can be polymeric or glass or the like. Cells 6 can have a moisture barrier layer 8 (FIG. 2) thereunder which can be composed of the same transparent polymeric material or glass as member 2 or other material if desired.

Figure 2:
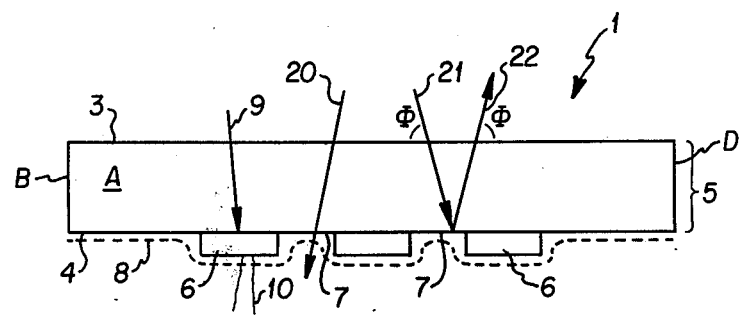
FIG. 2 shows a cross-section of the device of FIG. 1.

In FIG. 2 an incident ray of sunlight 9 entering device 1 directly over photovoltaic cell 6 will impact that cell and a part of its energy converted to electricity which is then removed by way of wires 10. A ray of sunlight entering device 1 by way of path 20 would miss all cells 6 and be lost for the generation of electricity.

Figure 3:
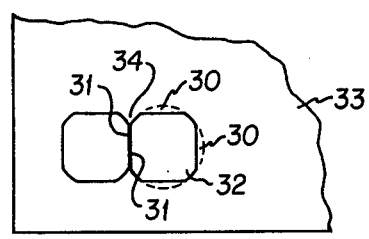
FIG. 3 shows a sample of prior art close packing of photovoltaic cells in a device such as that shown in FIG. 1.

Accordingly, even though photovoltaic cells are, due to the process by which they are manufactured, normally round in their initial configuration, the prior art has removed, as shown in FIG. 3, several hemispherical sections 30 in order to make straight sides 31 with rounded corners for the photovoltaic cells 32 in FIG. 3. This way, cells 31 can be packed even closer together under light transmitting member 33 of the array, thereby minimizing lost sunlight such as that represented by ray 20 of FIG. 2. The cost of this assembly for the amount of electricity recovered is, however, greatly increased because of the wasted sections 30. Also, even with such extremely close packing, there are still interstices 34 present.

It can also be seen from FIG. 2 that a ray of sunlight entering by way of path 21, if reflected by a shiny surfaced interstice 7 could be reflected back towards the side 3 of initial entry at the same angle of entry $\phi$ and therefore will escape through side 3 as shown by arrow 22 rather than be reflected back into the interior of member 2.

According to this invention photovoltaic cells are carried by (on the surface of or embedded in) at least one of the large surface area sides of the light transmitting member and the open interstices between adjacent cells then covered with a diffusive member to maximize the retention of light once it enters such member.

This invention can employ the superstrate or substrate approach. The light transmitting member need not be a structural supporting member.

This invention does not require close packing of cells as does the prior art. However, close packing can be employed if desired. For example, when using close packing an array having a diffusive member according to this invention will have a certain efficiency which is higher than an array with the same close packing of cells but no diffuser. An array under this invention could employ a smaller number of cells spaced apart over the same area light transmitting member and achieve greater efficiency per solar cell or per dollar of cost for the total system than a prior art array using close packing but no diffuser.

Thus, by this invention close packing can be eliminated if desired, less photovoltaic cells used, and a less expensive array produced, all without sacrifice in efficiency as compared to a close packed prior art array which has no diffuser.

Also, with an array of this invention, a larger area light transmitting member can be used for the same number of solar cells plus diffuser. This way, because it is a light concentrating device, more electricity can be obtained from the array.

Generally, only the interstices between the photovoltaic cells are covered with a diffusive member so that internal reflection and retention is improved by diffusing or otherwise breaking up light that enters the light transmitting member and strikes the diffusing member.

Figure 4:
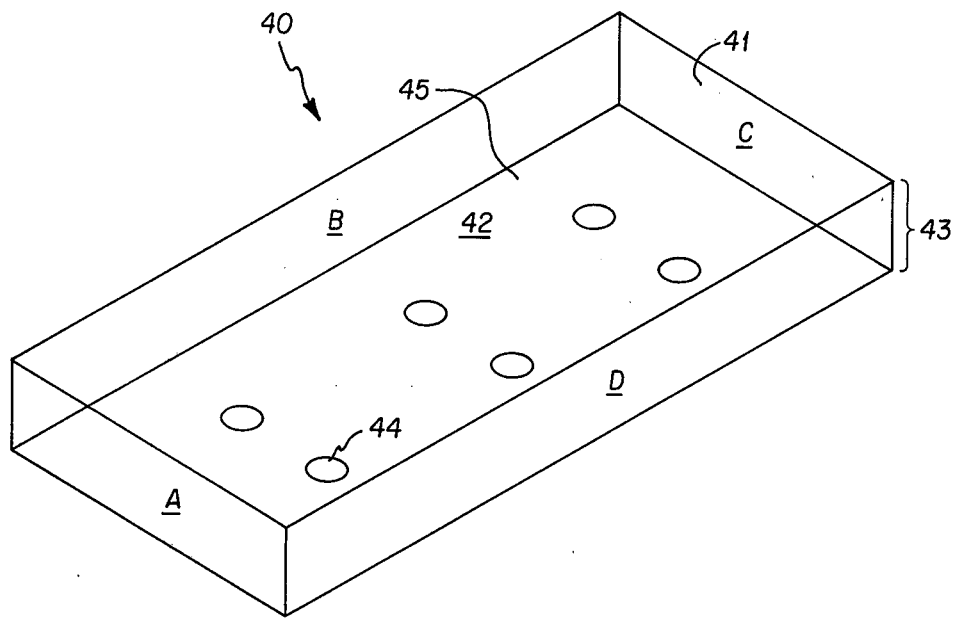
FIG. 4 shows a device in accordance with this invention.
Figure 5:
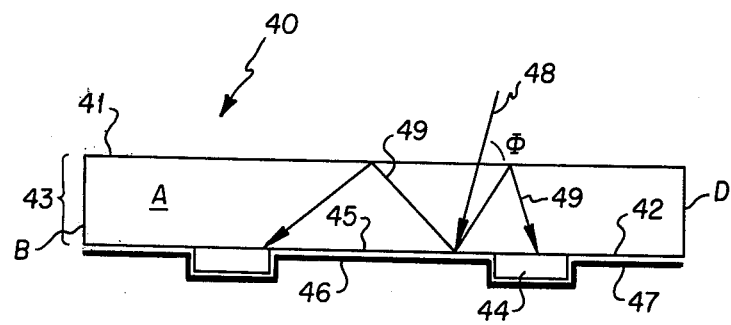
FIG. 5 shows a cross-section of the device of FIG. 4.

FIG. 4 shows an array in accordance with this invention except that the diffusive member is not shown for sake of clarity, such member being shown instead in FIG. 5.

FIG. 4 shows superstrate light transmitting member 40 which can be supportive if desired. Member 40 has a pair of opposed, essentially parallel, large area sides 41 and 42, sides 41 and 42 being joined by a plurality of upstanding edge faces A through D (referred to collectively as edge face 43). Edge face 43 has a substantially smaller area than sides 41 and/or 42. Member 40 carries on its underside 42 a plurality of photovoltaic cells 44. There are large open spaces 45 between cells 44 because prior art close packing is not necessary.

Referring to FIG. 5, a diffusive member 46 is emplaced to cover interstices 46 (this includes space 47 between cell 44 and edge face 43 if there is any such space). Accordingly, angularly incident sunlight ray 48 which could otherwise be lost to prior art photovoltaic array 1 even with close packing is internally broken up by diffuser 46 into subrays 49. Because a number of subrays 49 are reflected from side 42 at different angles from the initial entry angle $\theta$ of ray 48 into side 41, the chances for internal reflection of these subrays inside member 40 until they hit a cell 44 are increased over the chances of escape of the entire back reflected ray as shown by arrow 22 of FIG. 2. Put another way, if surface 42 were just reflective, e.g., mirrored, ray 48 could simply be reflected back out of the device through side 41 and lost. However, diffuser 46 breaks up such incident light so that it does not hit side 41 at the same angle in which it penetrated side 41 in the first place, thereby enhancing the internal reflection and retention of light energy which reaches the interior of member 40. It can readily be seen now that this invention is a concentrator in that it increases the amount of light that reaches a photovoltaic cell once it reaches the interior of member 40.

Diffuser 46 can serve as an environmental barrier in lieu of layer 8 of prior art FIG. 2.

Figure 6:
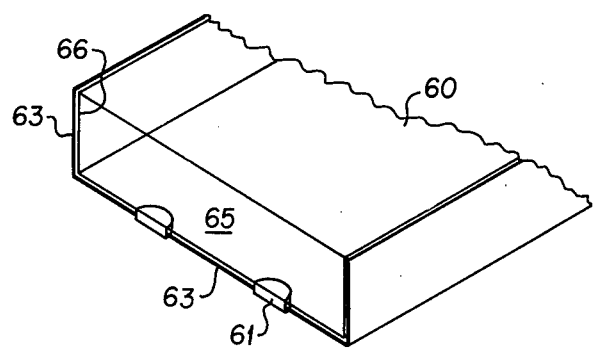
FIG. 6 shows a cross-section of another device within the scope of this invention.

FIG. 6 shows an embodiment within this invention wherein light transmitting member 60 has photovoltaic cells 61 on the bottom side 65 thereof and a diffuser member 63 covering not only bottom side 65 but also the collective edge face 66 for additional opportunity to diffuse and retain incident sunlight.

Figure 7:
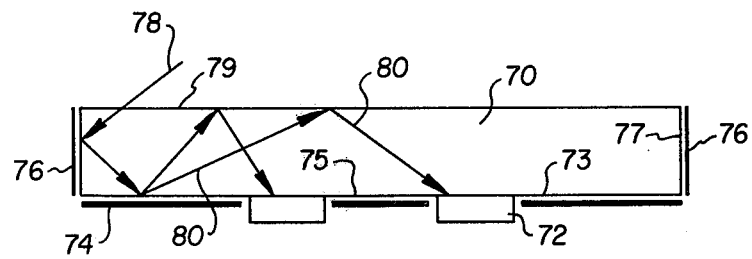
FIG. 7 shows another device of this invention.

FIG. 7 shows a cross-section of another embodiment within this invention wherein light transmitting member 70 has photovoltaic cells 72 on bottom side 73, diffuser 74 in interstices 75, and reflective material 76, e.g., a mirror, on collective edge face 77. Light ray 78 enters side 79, hits edge 77, and is reflected toward diffuser 74 for breaking up into subrays 80 rather than escaping from member 70 by passing through edge face 77.

The light transmitting member can be one or more layers of a polymeric material which is transparent at least to the visible light spectrum. Such material can therefore be a conventional plastic polymeric material such as polymethylmethacrylate, other known acrylic polymers, styrene polymers, and the like. The material can also be a glass or other transparent material which is nondeleterious to photovoltaic cells, and which can be formed into a structural shape. The material can be any light transmitting material heretofore used to cover commercial photovoltaic arrays. The member can vary from a thin, non-supportive film to a thick structurally supporting member.

Photovoltaic cells are well known in the art and vary widely as to their characteristics. For example, cells based on germanium, silicon, indium phosphide, gallium arsenide, cadmium telluride, aluminum antimonide, cupric oxide, selenium, gallium phosphide, cadmium sulfide, combinations thereof, and the like can be employed in this invention. The preparation of and characteristics of photovoltaic cells are well known in the semiconductor art and therefore further detailed description is unnecessary to inform one skilled in the art.

The photovoltaic cells can be attached to the light transmitting member in any conventional manner such as gluing with a transparent glue such as silicone, polyvinylbutyrate, and the like or any other manner known in the art. The photovoltaic cells employed in this invention can be of any size, shape, or configuration desired, although as will be shown later certain configurations are quite preferable.

Diffusive members 46, 63, and 74 can be made from any material which efficiently diffuses or otherwise breaks up visible light into subrays. This includes most any type of rough surfaced material. For example, etched glass or frosted glass or crinkled, or otherwise uneven surfaced metal foil such as silver foil, tin foil, and the like, can be used. Paint produces a satisfactory diffusive surface. Roughened or uneven surfaces made from anodized aluminum or mirrors, and the like, can be used.

Figure 8:
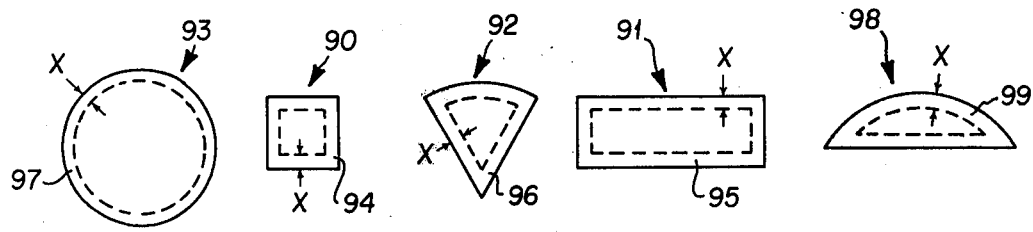
FIG. 8 shows various photovoltaic cell configurations that are useful in this invention.

It has been found that in this invention efficiency is increased by increasing the edge area of a photovoltaic cell in relation to its overall area. Therefore, the photovoltaic cells of this invention are preferably of a configuration which maximizes the edge area of the cell. For example, as shown in FIG. 8 this approach favors square 90, rectangular strip 91, semicircle 98, or pie shaped 92 configurations over the normal round configuration 93 of the prior art because edge areas 94, 95, 96, and 99 would be greater in area than edge area 97 when using the same inset distance for variable X for measuring the edge area of the configuration in relation to the total area of the same configuration. Thus, by this invention the configuration of a cell should be such that the ratio of the perimeter of the cell to the overall area of the same cell is greater than the perimeter to area ratio of a round cell having the same overall area.

Figure 9:
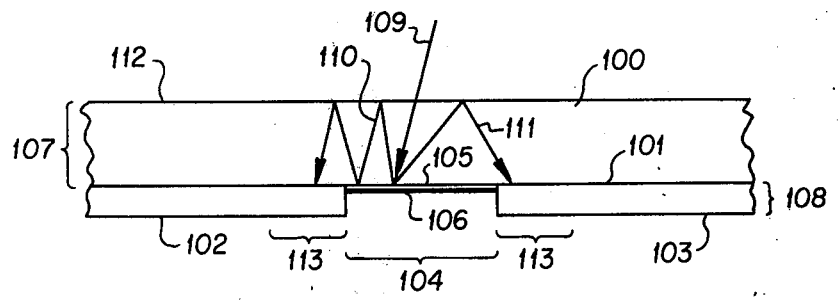
FIG. 9 shows a cross-section of a device within this invention which illustrates the edge effect of this invention.

FIG. 9 shows an enlarged cross-section of an array within this invention wherein superstrate light transmitting member 100 carries on its underside 101 two photovoltaic cells 102 and 103 which are spaced apart distance 104 to form an interstice or open space 105 which is covered by diffuser 106. Member 100 has a thickness 107 and cells 102 and 103 have a thickness 108. The overall area of member 100 and cells 102 and 103 is very large compared to the thicknesses 107 and 108 and therefore the full extent of the member themselves are not shown in this figure except that the areas are much larger than indicated. The edge effect phenomenon recognized by this invention is best demonstrated by considering incident light ray 109. Light ray 109 passes through member 100, strikes diffuser 106 and is broken up into a very large number of subrays, two of which are shown as subrays 110 and 111. Subrays 110 and 111 reflect back towards upper side 112 of member 100 and, for reasons discussed hereinabove, are then reflected back towards bottom side 101, which internal reflecting is repeated until the subrays are totally absorbed in member 100 or they reach a photovoltaic cell. Because the thickness 107 of member 100 is quite small relative to the overall area encompassed by the member, subrays 110 and 111 are going to predominantly impact on an edge area 113 of cells 102 and 103. Thus, the flux of subrays will be much greater in the edge area of the cells as opposed to the internal area of the same cells. This is why this invention emphasizes configurations of cells which maximize the amount of edge area 113 in relation to the overall area of the cell and thereby requires that the perimeter of the cell to the overall area of the same cell be greater than the perimeter to area ratio of a round cell having the same overall area.

In FIG. 9, for example, member 100 can have a thickness 107 of about ⅛ inch uniformly over its entire area, which area can cover a number of square feet, so that the thickness 107 relative to the area of member 100 is insubstantial thereby maximizing the flux of internally reflected light in the edge area of the cell with a correspondingly smaller flux of light in the interior of the cell.

Figure 10:
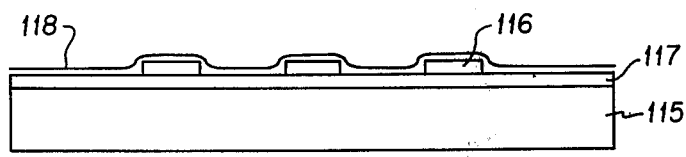
FIG. 10 shows a cross-section of a substrate embodiment within this invention.

FIG. 10 shows a substrate embodiment within this invention wherein a structural supporting substrate member 115 is employed under photovoltaic cells 116. Diffuser member 117 is employed between cells 116 and member 117. In the situation where member 115 is metallic or otherwise electrically conducting, diffuser 117 should be an electrical insulator as well as a diffuser. Light transmitting member 118 which covers cells 116 and provides an environmental barrier, is non-supporting and, as shown in FIG. 10, can be a thin film of material only a few mils thick. For example, member 118 can be an optically clear 4 mil thick film of uniform thickness throughout covering the entire top surface of the array of cells, interstices, and all.

Figure 11:
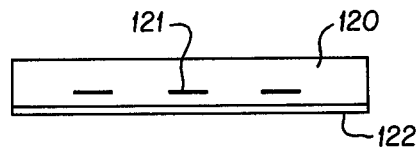
FIG. 11 shows an embedded cell embodiment within this invention.

FIG. 11 shows an embedded cell embodiment wherein light transmitting member 120 has the photovoltaic cells 121 embedded in the interior thereof with diffuser member 122 coating the bottom side of member 120.

EXAMPLE I

A rectangular planar light transmitting member composed of polymethylmethacrylate was prepared having an edge face height of about ⅛ inch and a large side surface area of each side of about 10 square inches. Ten commercial 3 inch diameter round, p-n junction silicon photovoltaic cells were fixed to one side of the member by gluing with silicone and wired together in parallel, leaving two wires external to the device for removal of electricity. All interstices between adjacent cells were covered with a diffusive member by spraying thereon white paint from a commercially available paint spray can.

The electrical generation efficiency of this device was about 7% greater than the same device without the diffusive member.

EXAMPLE II

Four polymethylmethacrylate light transmitting plates as described in Example I were prepared, each having glued thereto with silicone, differently configured photovoltaic cells of increasing perimeter to area ratios. The side of the plate which carried the cell had its open areas covered with a diffuser member composed of commercially available, white polyvinylfluoride.

The first plate carried a commercial 3 inch diameter round, silicon p-n junction photovoltaic cell.

The second plate carried a similar 3 inch silicon cell but cut into two hemispheres which were spaced apart on the plate.

The third plate carried a similar 3 inch silicon cell but cut into four pie-shaped quarters which were spaced apart on the plate.

The fourth plate carried four rectangular p-n junction silicon cells formed from the same material as plates 1 through 3. The rectangles each had dimensions of 0.59 inches by 3 inches and each had an overall area equal to the overall area of pie-shaped cell on plate 3. Thus, as with the cells of plates 2 and 3, the cumulative area of the four rectangular cells of plate 4 equalled the overall area of the single round cell of plate 1.

The perimeter to area ratio of the cells increased from its lowest for plate 1 up to its highest for plate 4.

The total amperage output from each plate was measured when subjected to the same intensity light. The results were as follows:

| Plate | Cell Type | Total Perimeter To Area Ratio | Total Output (Amps) |
|---|---|---|---|
| 1 | Round | 1.33 | 1.38 |
| 2 | Hemisphere | 2.18 | 1.56 |
| 3 | Pie-shaped | 3.03 | 1.72 |
| 4 | Rectangular | 4.06 | 1.80 |

It can be seen from the above data that the larger the edge area exposed to the light, with the total cell area remaining constant, the larger the total electrical output.

EXAMPLE III

A photovoltaic device was prepared using a commercial 3 inch diameter silicon p-n cell embedded in polyvinylbutyrate, with a clean glass superstrate and a white polyvinylfluoride diffuser substrate. Five tests were made under uniform light intensity. The first test used no diffuser. The next four tests used increasing areas of diffuser. The percent increase in short circuit current for the cell was determined in each test. The diffuser area was expressed in terms of the area of the silicon cell. The area of the cell was 7.07 square inches. The ratio of the total area exposed to the area of cell was termed R. Thus, when no diffuser was employed, R equalled 1; when the diffuser area equalled the cell area, R equalled 2; when the diffuser area was twice the cell area, R equalled 3; and so on. The results were as follows:

| Test | R (Total Area/ Cell Area) | Percent Increase In Short Circuit Current |
|---|---|---|
| 1 | 1 | 0 |
| 2 | 1.5 | 7 |
| 3 | 2 | 11 |
| 4 | 3 | 14 |
| 5 | 4 | 16 |

It can be seen from the above data that increasing the diffuser area around the cell increased the electrical output of the cell.

Reasonable variations and modifications are possible within the scope of this disclosure without departing from the spirit and scope of this invention.

The embodiments of the invention in which an exclusive property or privilege is claimed are defined as follows:

1. A photovoltaic array comprising a light transmitting member having at least one pair of opposed essentially parallel sides, each of said sides being joined by an edge face, a plurality of photovoltaic cells adapted to receive radiation transmitted through said member carried on at least one of said sides, said cells having interstices therebetween, and a light diffusive member on said at least one side covering at least part of said interstices whereby at least a part of the light internally reflected by said diffusive member is caused to impinge on said photovoltaic cells, thereby increasing photovoltaic conversion efficiency.

2. A device according to claim 1 wherein said light transmitting member is composed of at least one layer of a material selected from the group consisting of a polymeric material, glass, and combinations thereof.

3. A device according to claim 1 wherein said light transmitting member is essentially planar.

4. A device according to claim 1 wherein all of said photovoltaic cells are carried on the same side of said light transmitting member.

5. A device according to claim 1 wherein said diffusive member covers all interstices including any space between said cells and said edge face.

6. A device according to claim 5 wherein said diffusive member also covers said edge face.

7. A device according to claim 1 wherein said diffusive member is paint.

8. A device according to claim 1 wherein said diffusive member also covers said edge face.

9. A device according to claim 8 wherein said diffusive member is paint.

10. A device according to claim 9 wherein said paint is white paint.

11. A device according to claim 1 wherein said diffusive member is colored polymer.

12. A device according to claim 1 wherein said diffusive member is frosted glass.

13. A device according to claim 1 wherein said diffusive member also constitutes a moisture barrier.

14. A device according to claim 1 wherein said photovoltaic cells are of a configuration which maximizes their edge area.

15. A device according to claim 14 wherein said cells are rectangular strips.

16. A device according to claim 14 wherein said cells are square.

17. A device according to claim 14 wherein said cells are pie-shaped.

18. A device according to claim 1 wherein said light transmitting member is a thin optically clear film.

19. A device according to claim 1 wherein the ratio of the perimeter of each of said cells to the overall area of each of said cells is greater than the perimeter to area ratio of a round cell having the same overall area.

20. A device according to claim 1 wherein said cells are embedded in said light transmitting member.

21. A device according to claim 1 wherein said light transmitting member is a superstrate.

22. A device according to claim 21 wherein said superstrate is a structural support member.

23. A device according to claim 21 wherein said superstrate is a thin film.

24. A device according to claim 1 wherein said cells are a plurality of spaced apart rectangular strips and diffuser is carried between said strips.

* * * * *

REEXAMINATION CERTIFICATE (92nd)

United States Patent [19]
Yerkes et al.

[11] B1 4,116,718
[45] Certificate Issued  Jun. 7, 1983

[54] PHOTOVOLTAIC ARRAY INCLUDING LIGHT DIFFUSER

[75] Inventors: John W. Yerkes, Granada Hills; James E. Avery, Burbank, both of Calif.

[73] Assignee: Atlantic Richfield Company, Los Angeles, Calif.

Reexamination Request
No. 90/000,152, Feb. 1, 1982

Reexamination Certificate for:
Patent No.: 4,116,718
Issued: Sep. 26, 1978
Appl. No.: 884,861
Filed: Mar. 9, 1978

[51] Int. Cl.³ .................................. H01L 31/04
[52] U.S. Cl. ........................... 136/246; 136/251
[58] Field of Search ..................... 136/246, 251

[56] References Cited

U.S. PATENT DOCUMENTS

| | | | |
|---|---|---|---|
| 2,001,672 | 5/1935 | Carpenter | 338/17 |
| 2,888,007 | 5/1959 | Tabor | 126/417 |
| 3,179,861 | 4/1965 | Sclar | 357/29 |
| 3,487,223 | 12/1969 | St. John | 250/216 |
| 3,971,672 | 7/1976 | Lampkin | 136/246 |
| 3,973,994 | 8/1976 | Redfield | 136/259 |
| 4,055,761 | 10/1977 | Shimomura | 250/239 |
| 4,246,042 | 1/1981 | Knasel et al. | 136/246 |

OTHER PUBLICATIONS

D. A. Corbett et al, "Lightweight Rigid Solar Array Structural Considerations," *Conf. Record, 11th IEEE Photovoltaic Specialists Conf.* (1975), pp 103–109.

R. L. Phillips et al, "A New Flat Plate Solar Collector Using Total Internal Reflection For Light Trapping," *Proceedings, 1977 Flat Plate Solar Collector Conf.*, pp 239–243.

H. S. Rauschenbach et al, "FEP-Teflon Encapsulated Solar Cell Modules—Further Progress," *Conf. Record, 11th IEEE Photovoltaic Specialists Conf.* (1975), pp 162–168.

D. A. Carmichael et al, "Materials For Encapsulation Systems For Terrestrial Photovoltaic Arrays," *Conf. Record, 12th IEEE Photovoltaic Specialists Conf.* (1976), pp 317–331.

U.S. DOE, *Energy Research Abstracts*, Vol. 3, No. 6, March 31, 1978, Abstract No. 11839, Page 1245.

U.S. Dept. of Commerce, NTIS, *Government Reports Announcements and Index*, May 12, 1978, Page 159.

U.S. DOE, *Energy Research Abstracts*, Vol. 3, No. 14, July 31, 1978, Abstract No. 32886, Page 3404.

U.S. Dept. of Commerce, NTIS, *Government Reports Announcements and Index*, Sept. 1, 1978, Page 187.

N. F. Shepard, "Development and Testing of Shingle-Type Solar Cell Modules, Quarterly Report No. 1" (ERDA/JPL/954607-77/1). Oct. 5, 1977.

N. F. Shepard, "Development and Testing of Shingle-Type Solar Cell Modules, Quarterly Report No. 2" (DOE/JPL/954607-2). Jan. 5, 1978.

R. K. Yasui et al, "Utilization of Space Technology For Terrestrial Solar Power Applications" *Conf. Record, 10th IEEE Photovoltaic Specialists Conf.* (1973), pp 239–253.

Y. Salles, "L'évolution Industrielle des Cellules Solaires au Silicium," *Acta Electronica*, Vol. 18, pp 339–343 (1975).

*Primary Examiner*—Aaron Weisstuch

[57] ABSTRACT

A photovoltaic array composed of a light transmitting member having a plurality of sides, at least one photovoltaic means carried by at least one of said sides, and a diffusive member covering a portion of said device.

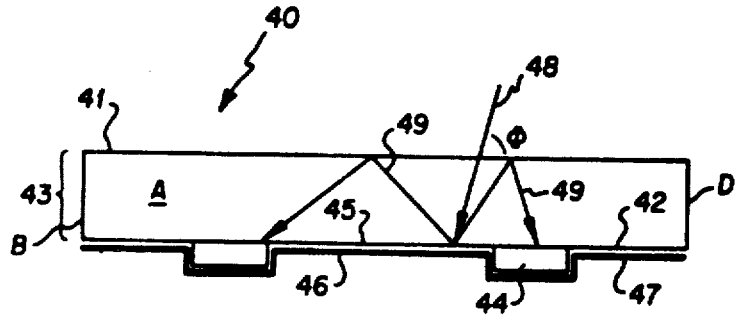

REEXAMINATION CERTIFICATE ISSUED UNDER 35 U.S.C. 307.

THE PATENT IS HEREBY AMENDED AS INDICATED BELOW.

Matter enclosed in heavy brackets appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-5, 11-13, 20-22, and 24 is confirmed.

Claims 6-8, 14, 18, 19, and 23 are determined to be patentable as amended:

6. [A device according to claim 5] *A photovoltaic array comprising a light transmitting member having at least one pair of opposed essentially parallel sides, each of said sides being joined by an edge face, a plurality of photovoltaic cells adapted to receive radiation transmitted through said member carried on at least one of said sides, said cells having interstices therebetween, and a light diffusive member on said at least one side covering at least part of said interstices whereby at least a part of the light internally reflected by said diffusive member is caused to impinge on said photovoltaic cells, thereby increasing photovoltaic conversion efficiency wherein said diffusive member covers all interstices including any space between said cells and said edge face and* wherein said diffusive member also covers said edge face.

7. [A device according to claim 1] *A photovoltaic array comprising a light transmitting member having at least one pair of opposed essentially parallel sides, each of said sides being joined by an edge face, a plurality of photovoltaic cells adapted to receive radiation transmitted through said member carried on at least one of said sides, said cells having interstices therebetween, and a light diffusive member on said at least one side covering at least part of said interstices whereby at least a part of the light internally reflected by said diffusive member is caused to impinge on said photovoltaic cells, thereby increasing photovoltaic conversion efficiency* wherein said diffusive member is paint.

8. [A device according to claim 1] *A photovoltaic array comprising a light transmitting member having at least one pair of opposed essentially parallel sides, each of said sides being joined by an edge face, a plurality of photovoltaic cells adapted to receive radiation transmitted through said member carried on at least one of said sides, said cells having interstices therebetween, and a light diffusive member on said at least one side covering at least part of said interstices whereby at least a part of the light internally reflected by said diffusive member is caused to impinge on said photovoltaic cells, thereby increasing photovoltaic conversion efficiency* wherein said diffusive member also covers said edge face.

14. [A device according to claim 1] *A photovoltaic array comprising a light transmitting member having at least one pair of opposed essentially parallel sides, each of said sides being joined by an edge face, a plurality of photovoltaic cells adapted to receive radiation transmitted through said member carried on at least one of said sides, said cells having interstices therebetween, and a light diffusive member on said at least one side covering at least part of said interstices whereby at least a part of the light internally reflected by said diffusive member is caused to impinge on said photovoltaic cells, thereby increasing photovoltaic conversion efficiency* wherein said photovoltaic cells are of a configuration which maximizes their edge area.

18. [A device according to claim 1] *A photovoltaic array comprising a light transmitting member having at least one pair of opposed essentially parallel sides, each of said sides being joined by an edge face, a plurality of photovoltaic cells adapted to receive radiation transmitted through said member carried on at least one of said sides, said cells having interstices therebetween, and a light diffusive member on said at least one side covering at least part of said interstices whereby at least a part of the light internally reflected by said diffusive member is caused to impinge on said photovoltaic cells, thereby increasing photovoltaic conversion efficiency* wherein said light transmitting member is a thin optically clear film.

19. [A device according to claim 1] *A photovoltaic array comprising a light transmitting member having at least one pair of opposed essentially parallel sides, each of said sides being joined by an edge face, a plurality of photovoltaic cells adapted to receive radiation transmitted through said member carried on at least one of said sides, said cells having interstices therebetween, and a light diffusive member on said at least one side covering at least part of said interstices whereby at least a part of the light internally reflected by said diffusive member is caused to impinge on said photovoltaic cells, thereby increasing photovoltaic conversion efficiency* wherein the ratio of the perimeter of each of said cells to the overall area of said cells is greater than the perimeter to area ratio of a round cell having the same overall area.

23. [A device according to claim 21] *A photovoltaic array comprising a light transmitting member having at least one pair of opposed essentially parallel sides, each of said sides being joined by an edge face, a plurality of photovoltaic cells adapted to receive radiation transmitted through said member carried on at least one of said sides, said cells having interstices therebetween, and a light diffusive member on said at least one side covering at leqst part of said interstices whereby at least a part of the light internally reflected by said diffusive member is caused to impinge on said photovoltaic cells, thereby increasing photovoltaic conversion efficiency wherein said light transmitting member is a superstrate and* wherein said superstrate is a thin film.

Claims 9, 10, and 15-17, dependent on amended claims, are determined to be patentable.

* * * * *